United States Patent
Shi

(10) Patent No.: US 9,919,812 B2
(45) Date of Patent: Mar. 20, 2018

(54) EARLY DETECTION OF FAULTY DEICING HEATERS ON WIDE-BODY AIRCRAFT

(71) Applicant: THE BOEING COMPANY, Chicago, IL (US)

(72) Inventor: Fong Shi, Chicago, IL (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/231,568

(22) Filed: Aug. 8, 2016

(65) Prior Publication Data

US 2018/0037338 A1 Feb. 8, 2018

(51) Int. Cl.
*B64F 5/00* (2017.01)
*G08B 31/00* (2006.01)
*G08B 21/18* (2006.01)
*B64D 45/00* (2006.01)
*G08B 21/20* (2006.01)

(52) U.S. Cl.
CPC ............ *B64F 5/0045* (2013.01); *B64D 45/00* (2013.01); *G08B 21/182* (2013.01); *G08B 21/185* (2013.01); *G08B 31/00* (2013.01); *B64D 2045/0085* (2013.01); *G08B 21/20* (2013.01)

(58) Field of Classification Search
CPC .................. B64F 5/0045; B64D 45/00; B64D 2045/0085; G08B 21/182; G08B 21/185; G08B 21/20; G08B 31/00
USPC ........................................................ 701/33.7
See application file for complete search history.

(56) References Cited

U.S. PATENT DOCUMENTS

| | | | |
|---|---|---|---|
| 5,361,183 A | 11/1994 | Wiese | |
| 2011/0149447 A1 | 6/2011 | Fink et al. | |
| 2012/0221262 A1* | 8/2012 | Nakagawa | B64C 13/50 702/58 |
| 2013/0070374 A1* | 3/2013 | Hofheinz | H02H 3/332 361/42 |
| 2013/0128396 A1* | 5/2013 | Danesh | G01R 19/00 361/45 |
| 2013/0271298 A1* | 10/2013 | Restrepo | G01R 31/025 340/945 |
| 2014/0257624 A1* | 9/2014 | Safa-Bakhsh | G06F 17/00 701/31.4 |

(Continued)

FOREIGN PATENT DOCUMENTS

| | | |
|---|---|---|
| EP | 2783988 | 10/2014 |
| EP | 2829473 | 1/2015 |

*Primary Examiner* — Atul Trivedi
(74) *Attorney, Agent, or Firm* — Haynes and Boone, LLP

(57) ABSTRACT

A system and method for monitoring a critical component (e.g., an electrical deicing heater) on an aircraft. A first electrical current is input into the critical component, a second electrical current is returned from the critical component, and an electrical differential current of the critical component is detected. The electrical differential current is the difference between the first electrical current and the second electrical current. An electrical differential current signal is generated from the detected electrical differential current. The electrical differential current signal is compared to a differential current threshold, and precautionary action is triggered based on the comparison. A deterioration trend of the critical component is monitored by tracking variations in the electrical differential current of the critical component over time.

23 Claims, 3 Drawing Sheets

(56) References Cited

U.S. PATENT DOCUMENTS

| | | | | |
|---|---|---|---|---|
| 2015/0185128 A1* | 7/2015 | Chang | ............... | G01M 5/0091 |
| | | | | 702/35 |
| 2015/0318705 A1* | 11/2015 | Lucas | ................... | H02J 3/381 |
| | | | | 307/129 |
| 2015/0346255 A1* | 12/2015 | Wagner | .............. | H02H 1/0015 |
| | | | | 702/58 |
| 2016/0052642 A1* | 2/2016 | Gordon | ............... | B64D 45/00 |
| | | | | 701/3 |
| 2017/0184469 A1* | 6/2017 | Chang | ............... | G01M 5/0016 |
| 2017/0184650 A1* | 6/2017 | Chang | .................. | G01R 31/02 |
| 2017/0283086 A1* | 10/2017 | Garing | ........... | B64D 11/00155 |

* cited by examiner

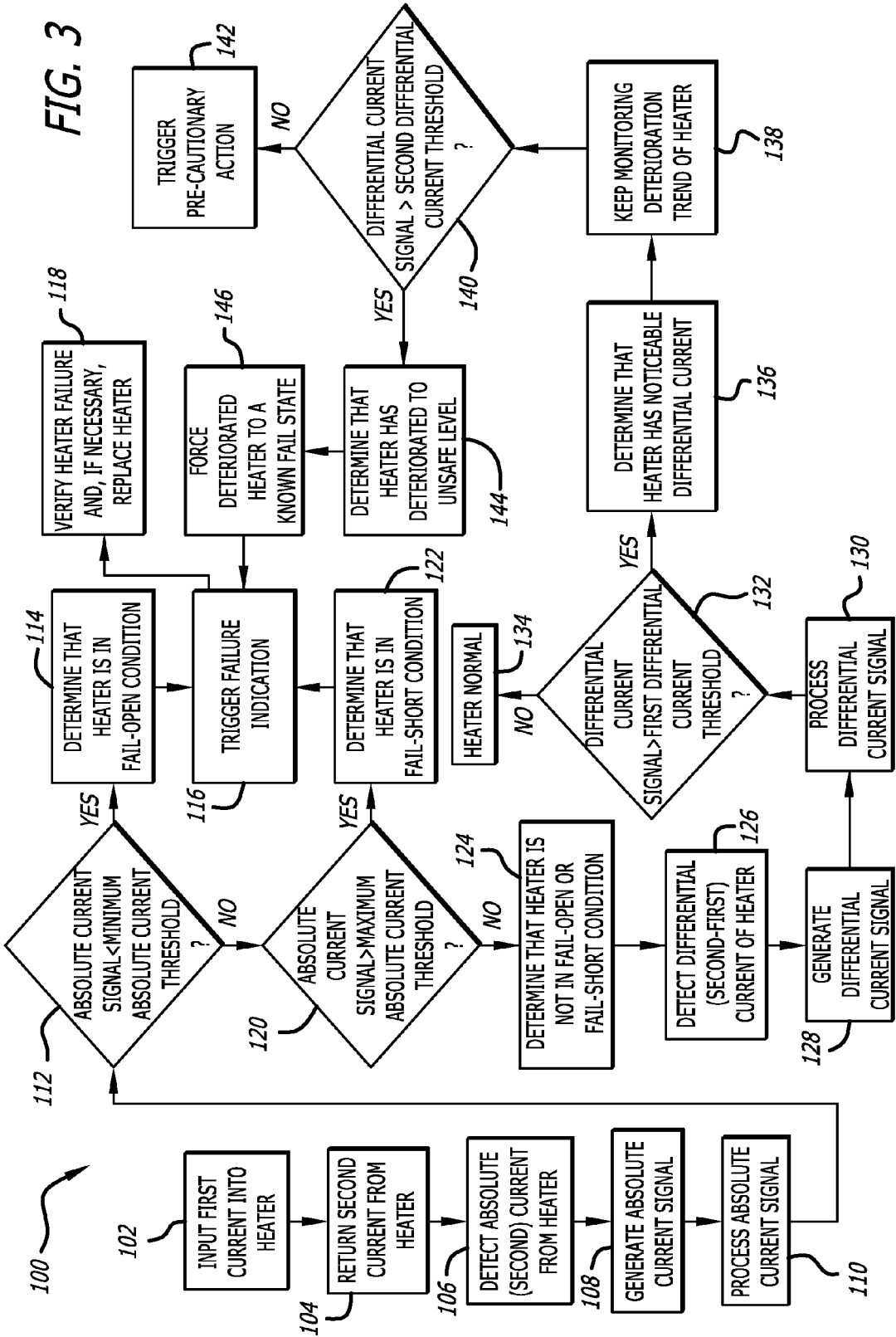

EARLY DETECTION OF FAULTY DEICING HEATERS ON WIDE-BODY AIRCRAFT

FIELD

The present disclosure generally relates to the detection of faulty components on aircraft, and in particular, the detection of faulty deicing heaters on wide-body aircraft.

BACKGROUND

Airplane flight relies on various control surfaces, sensors, transducers, and probes to function properly. Many of these critical components are externally mounted on aircraft, and are therefore subject to several environmental challenges. Accumulation of ice, snow, or frost on leading edges and horizontal and vertical stabilizer surfaces may alter their aerodynamic shapes, which may ultimately lead to loss of control or insufficient lift to keep the aircraft airborne. Accumulation of ice, snow, or frost on sensors, transducers, and probes may lead to erroneous data readings, which may also have a deleterious effect on the functioning of the aircraft, which may be catastrophic.

To prevent ice formation in flight, hot bleed air from one or more engine compressors is used to melt, and therefore prevent dangerous build up, of ice, snow, or frost on the critical components exposed to the external environment. However, air ducts are required to convey the hot bleed air from the engine compressors to the critical components, thereby increasing the weight, engine thrust requirements, and fuel burn. For this reason, hot bleed air heating systems have been replaced by electric deicing heaters on newer aircraft. These deicing heaters are composed of resistive coils or elements embedded in metal cases, metal parting strips, or carbon fiber composite structures, which are typically incorporated into the sensors, transducers, and probes to form structurally integrated units.

Salt, sand, pollutants, volcanic ash, ice, moisture, insects, plus shock, vibration, pressure, temperature cycles, etc., degrade the performance of these deicing heaters, thereby reducing the component's service life to four to five years. From field returns, it has been discovered that, over time, corroded deicing heaters, due to degraded insulation that loses its electrically insulative properties, develop conductive paths to the heater case, which is bonded to the chassis of the aircraft. Such conductive paths shunt away the heating current, allowing ice, snow, or frost to form, rebuild, and accumulate in flight.

Airplane onboard systems monitor the electrical current of these deicing heaters to determine the existence of a fault condition. A warning indication is generated based on monitoring the operating current of these heaters. However, due to manufacturing tolerance, supply voltage variations, and transient behaviors of the deicing heater current, existing onboard monitoring systems are designed to operate with large fluctuations of the heater current under all operating conditions. For example, as the temperature of the heater increases, the heater resistance increases, thereby decreasing the heater current. As such, current onboard monitoring systems are designed to only determine two distinct fail conditions based on two predetermined current thresholds: a "fail-open" if measured heater current reaches its minimum threshold (e.g., 30 mA) and a "fail-short" if measured heater current reaches its maximum threshold (e.g., 3 A). In fact, cases for "fail-open" can be either "cable-open," or "connector-open," or "heating element-open," and cases for "fail-short" can be either "cable-short" or "connector-short." However, many failed or failing electrical deicing heaters draw electrical current in the range between the minimum and maximum failure thresholds, and are therefore interpreted as being in a "no-fault" condition by the on-board monitoring system.

Thus, today's on-board monitoring systems are unaware of the timely deteriorations of electrical deicing heaters until the current magnitude gradually becomes sufficiently high to trip an upstream circuit breaker, which results in the identification of a "fail-short" condition, or the deicing heater is burned open, resulting in the identification of a "fail-open" condition. Thus, not until the deicing heater has completely failed, which typically occurs in-flight, will there be any indication that a failure has occurred. As such, the existing on-board monitoring systems cannot recognize a large percentage of deicing heaters that have failed in service. A degraded electrical deicing heater will no longer perform its intended function, causing instrument errors, disagreement in altitudes and airspeed from these "no-fault" probes, which may lead to cockpit confusion and aircraft stall absent intervention.

For example, wide-body aircraft typically have multiple probes measuring airplane's air speed, total air temperature, and angle-of-attack. These external mounted sensors often have embedded electrical deicing heaters that respectively receive power from the left, center, and right control panels in the cockpit, and provide data to the corresponding onboard flight control systems. With respect to air speed probes, failure of one or more of the electrical deicing heaters may cause substantially different air speed readings among these probes. There is no flight deck warning-indication until an air-data split, i.e., airspeed readings for captain and first officer are in disagreement due to an icing event. Upon noticing an air-data split, airline pilots are trained to first disengage the autopilot and auto-throttle, fly the aircraft manually, and land the airplane at a nearby airport. When ice forms and melts during flight, intermittent errors often result in the pilots' decision for Air Turn Back (ATB). Since the 1990s, the worldwide wide-body fleet has had numerous incidents of such event occurring in-flight. On the ground, maintenance crew will remove these air probes and measure the insulation resistance of each to determine which one is faulty. To eliminate failure of air data probes in-flight, airlines are forced to shorten the removal and replacement schedule, which may be as short as 13,000 flight hours or three years for the wide-body fleet. As such, air data probes are typically prematurely replaced even when they are properly functioning. This costly issue has been frequently raised by airlines, since the early 1990s.

There, thus, remains a need for an on-board monitoring system that monitors and reports the trend in the health status of critical components, including electrical deicing heaters, detects the failure of critical components in advance, and annunciates cockpit warnings at an early stage before complete failure of the critical components (e.g., before airspeed disagreement).

SUMMARY

The present inventions are directed to a system or method for monitoring a critical component on an aircraft. Although the present inventions lend themselves well to use on wide-body aircraft, it should be appreciated that the present inventions can also be used on other types of fixed-wing aircraft, and even on rotary-wing aircraft, where it is desirable to monitor the health of critical components. The critical component to be monitored may be an electrical deicing heater, which can be integrated into a sensor, transducer, or probe, such as an air speed probe, and mounted to an external surface of the aircraft.

In accordance with a first aspect of the present inventions, a system for monitoring a critical component on an aircraft comprises a differential current sensor configured for detecting an electrical differential current of the critical component, and generating an electrical differential current signal from the detected electrical differential current. The electrical differential current is the difference between a first electrical current input into the critical component and a second electrical current returned from the critical component. The differential current sensor may be configured for electrically isolating the critical component from the remaining portion of the system. In one embodiment, the differential current sensor is an electrical current transformer, which may comprise a magnetic core, and a first pair of wires wound in the same direction around one side of the magnetic core to form a primary winding on which the electrical differential current of the critical component appears, and a second pair of wires wound in the same direction around the magnetic core to form a secondary winding on which the electrical differential current signal is generated. The electrical current transformer may have a turns-ratio greater than one, such that electrical differential current signal is an amplified or scaled version of the electrical differential current of the critical component.

The system further comprises at least one processor configured for comparing the electrical differential current signal to at least one differential current threshold, and triggering a precautionary action based on the comparison. The differential current processor may optionally be further configured for monitoring a deterioration trend of the critical component by tracking variations in the electrical differential current of the critical component over time.

In one embodiment, the processor(s) is configured for processing the electrical differential current signal by performing one or more of the following: filtering the electrical differential current signal prior to the comparison to remove current spike bursts from the electrical differential current signal, and/or delaying the electrical differential current signal prior to the comparison to eliminate false triggering of the precautionary action otherwise caused by inadvertent transients in the electrical differential current signal, and/or digitizing the electrical differential current signal, and/or scaling the electrical differential current signal. In another embodiment, the system may further comprise bias and threshold circuitry configured for providing the at least one differential current threshold to the at least one processor and/or an electrical surge protector configured for suppressing voltage spikes induced on the differential current sensor.

In still another embodiment, the processor(s) is configured for triggering the precautionary action only if the electrical differential current signal exceeds one of the differential current threshold(s). Triggering the precautionary action may, e.g., comprise generating an early warning signal indicating that the critical component requires attention for inspection or replacement. In this case, the system may further comprise a cockpit warning/alert indicator configured for receiving the early warning signal and annunciating a cockpit warning to a pilot of the aircraft and/or an Aircraft Health Management (AHM) system configured for receiving the early warning signal from the differential current processor and recommending inspection or replacement of the critical component.

In yet another embodiment, the differential current threshold(s) comprises a first differential current threshold and a second differential current threshold greater than the first differential current threshold. In this case, the differential current processor(s) may be configured for triggering the precautionary action based on the comparison between the electrical differential current signal and the first differential current threshold, and triggering a failure indication based on the comparison between the electrical differential current signal and the second differential current threshold. The failure indication may, e.g., comprise generating an alert signal indicating that the critical component has deteriorated to a point requiring replacement. In one embodiment, the differential current processor is configured for generating an electrical current interruption signal based on the comparison between the electrical differential current signal and the second differential current threshold. In this case, the system further comprises a relay interface configured for receiving the electrical current interruption signal, and in response thereto, interrupting the first electrical current input into the critical component, thereby forcing the critical component to a known failed state.

The system may optionally comprise an absolute current sensor configured for detecting an electrical absolute current returned from the critical component, and generating an electrical absolute current signal from the detected electrical absolute current, in which case, the at least one processor may be configured for comparing the electrical absolute current signal to at least one absolute current threshold, and triggering a failure indication based on the comparison. For example, the absolute current threshold(s) may comprise a minimum absolute current threshold and a maximum absolute current threshold, in which case, the processor(s) may be configured for triggering the failure indication only if the electrical absolute current signal is below the minimum absolute current threshold or above the maximum absolute current threshold. The processor(s) may comprise a differential current processor for performing the aforementioned differential current comparison function, and an absolute current processor for performing the aforementioned absolute current comparison function, which processors may be physically distinct from each other.

In accordance with a second aspect of the present inventions, a method of monitoring a critical component on an aircraft comprises inputting a first electrical current into the critical component, returning a second electrical current by the critical component, detecting an electrical differential current of the critical component, and generating an electrical differential current signal from the detected electrical differential current. The electrical differential current is the difference between the first electrical current and the second electrical current.

The method further comprises comparing the electrical differential current signal to at least one differential current threshold, and triggering a precautionary action based on the comparison. An optional method comprises monitoring a deterioration trend of the critical component by tracking variations in the electrical differential current of the critical component over time. Prior to the comparison function, the electrical differential current signal may be processed by performing one or more of the following: filtering the electrical differential current signal prior to the comparison to remove current spike bursts from the electrical differential current signal, and/or delaying the electrical differential current signal prior to the comparison to eliminate false triggering of the precautionary action otherwise caused by inadvertent transients in the electrical differential current signal, and/or digitizing the electrical differential current signal, and/or scaling the electrical differential current signal.

In one method, the precautionary action is only triggered if the electrical differential current signal exceeds one of the differential current threshold(s). As one example, triggering the precautionary action may comprise annunciating a warning to a pilot of the aircraft that the critical component requires attention for inspection or replacement and/or informing an Aircraft Health Management (AHM) system that the critical component requires attention for inspection. The differential current threshold(s) may comprise a first differential current threshold and a second differential current threshold greater than the first differential current threshold. In this case, the precautionary action may be triggered based on the comparison between the electrical differential current signal and the first differential current threshold, and the method may further comprise triggering a failure indication based on the comparison between the electrical differential current signal and the second differential current threshold. The failure indication may, e.g., comprise annunciating a cockpit alert to a pilot of the aircraft that the critical component requires replacement. The method may optionally comprise, based on the comparison between the electrical differential current signal and the second differential current threshold, interrupting the first electrical current input into the critical component, thereby forcing the critical component to a known failed state.

Optionally, the method may further comprise detecting an electrical absolute current returned from the critical component, generating an electrical absolute current signal from the detected electrical absolute current, comparing the electrical absolute current signal to at least one absolute current threshold, and triggering a failure indication based on the comparison. The absolute current threshold(s) may comprise a minimum absolute current threshold and a maximum absolute current threshold, in which case, the failure indication may be triggered only if the electrical absolute current signal is below the minimum absolute current threshold or above the maximum absolute current threshold.

In accordance with a third aspect of the present inventions, a system for monitoring a critical component on an aircraft comprises a differential current sensor configured for detecting an electrical differential current of the critical component, and generating an electrical differential current signal from the detected electrical differential current. The electrical differential current is the difference between a first electrical current input into the critical component and a second electrical current returned from the critical component. The differential current sensor may be configured for electrically isolating the critical component from the remaining portion of the system. In one embodiment, the differential current sensor is an electrical current transformer, which may comprise a magnetic core, and a first pair of wires wound in the same direction around one side of the magnetic core to form a primary winding on which the electrical differential current of the critical component appears, and a second pair of wires wound in the same direction around the magnetic core to form a secondary winding on which the electrical differential current signal is generated. The electrical current transformer may have a turns-ratio greater than one, such that electrical differential current signal is an amplified or scaled version of the electrical differential current of the critical component.

The system further comprises at least one processor configured for processing the electrical differential current signal; for example, by performing one or more of the following: filtering the electrical differential current signal to remove current spike bursts from the electrical differential current signal, delaying the electrical differential current signal, digitizing the electrical differential current signal, scaling the electrical differential current signal, amplifying the electrical differential current signal, and conditioning the electrical differential current signal.

The processor(s) is configured for monitoring a deterioration trend of the critical component by tracking variations in the processed electrical differential current over time. In one embodiment, the processor(s) comprises a differential current processor configured for both processing the electrical differential current signal, and monitoring the deterioration trend of the critical component. In another embodiment, the processor(s) comprises a differential current processor configured for processing the electrical differential current signal, and an Aircraft Health Management (AHM) system configured for receiving the processed electrical differential current signal from the differential current processor, and monitoring the deterioration trend of the critical component. The processor(s) may be further configured for determining a deterioration level of the critical component based on the processed electrical differential current signal, comparing the deterioration level of the critical component to a deterioration threshold, and recommending or requiring replacement of the critical component based on the comparison.

The system may optionally comprise an absolute current sensor configured for detecting an electrical absolute current returned from the critical component, and generating an electrical absolute current signal from the detected electrical absolute current, in which case, the processor(s) may be configured for comparing the electrical absolute current signal to at least one absolute current threshold, and triggering a failure indication based on the comparison. For example, the absolute current threshold(s) may comprise a minimum absolute current threshold and a maximum absolute current threshold, in which case, the processor(s) may be configured for triggering the failure indication only if the electrical absolute current signal is below the minimum absolute current threshold or above the maximum absolute current threshold. The processor(s) may comprise a differential current processor for performing the aforementioned differential current comparison function, and an absolute current processor for performing the aforementioned absolute current comparison function, which processors may be physically distinct from each other.

In accordance with a fourth aspect of the present inventions, a method for monitoring a critical component on an aircraft comprises inputting a first electrical current into the critical component, returning a second electrical current by the critical component, detecting an electrical differential current of the critical component, and generating an electrical differential current signal from the detected electrical differential current. The electrical differential current is the difference between the first electrical current and the second electrical current.

The method further comprises processing the electrical differential current signal For example, the electrical differential current signal may be processed by performing one or more of the following: filtering the electrical differential current signal prior to the comparison to remove current spike bursts from the electrical differential current signal, and/or delaying the electrical differential current signal prior to the comparison to eliminate false triggering of the precautionary action otherwise caused by inadvertent transients in the electrical differential current signal, and/or digitizing the electrical differential current signal, and/or scaling the electrical differential current signal.

The method further comprises monitoring a deterioration trend of the critical component based on the processed electrical differential current signal by tracking variations in the processed electrical differential current of the critical component over time. One method comprises determining a deterioration level of the heater based on the processed electrical differential current signal, comparing the deterioration level of the heater to a deterioration threshold, and recommending or requiring replacement of the critical component based on the comparison.

An optional method further comprises detecting an electrical absolute current returned from the critical component, generating an electrical absolute current signal from the detected electrical absolute current, comparing the electrical absolute current signal to at least one absolute current threshold, and triggering a failure indication based on the comparison. The absolute current threshold(s) may comprise a minimum absolute current threshold and a maximum absolute current threshold, in which case, the failure indication is triggered only if the electrical absolute current signal is below the minimum absolute current threshold or above the maximum absolute current threshold.

Other and further aspects and features of the invention will be evident from reading the following detailed description of the preferred embodiments, which are intended to illustrate, not limit, the invention.

BRIEF DESCRIPTION OF DRAWINGS

The drawings illustrate the design and utility of preferred embodiments of the present invention, in which similar elements are referred to by common reference numerals. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 3 is a flow diagram of one method of operating the on-board critical component monitoring system for monitoring the health of an electrical deicing heater of the aircraft.

DETAILED DESCRIPTION

Figure 1:
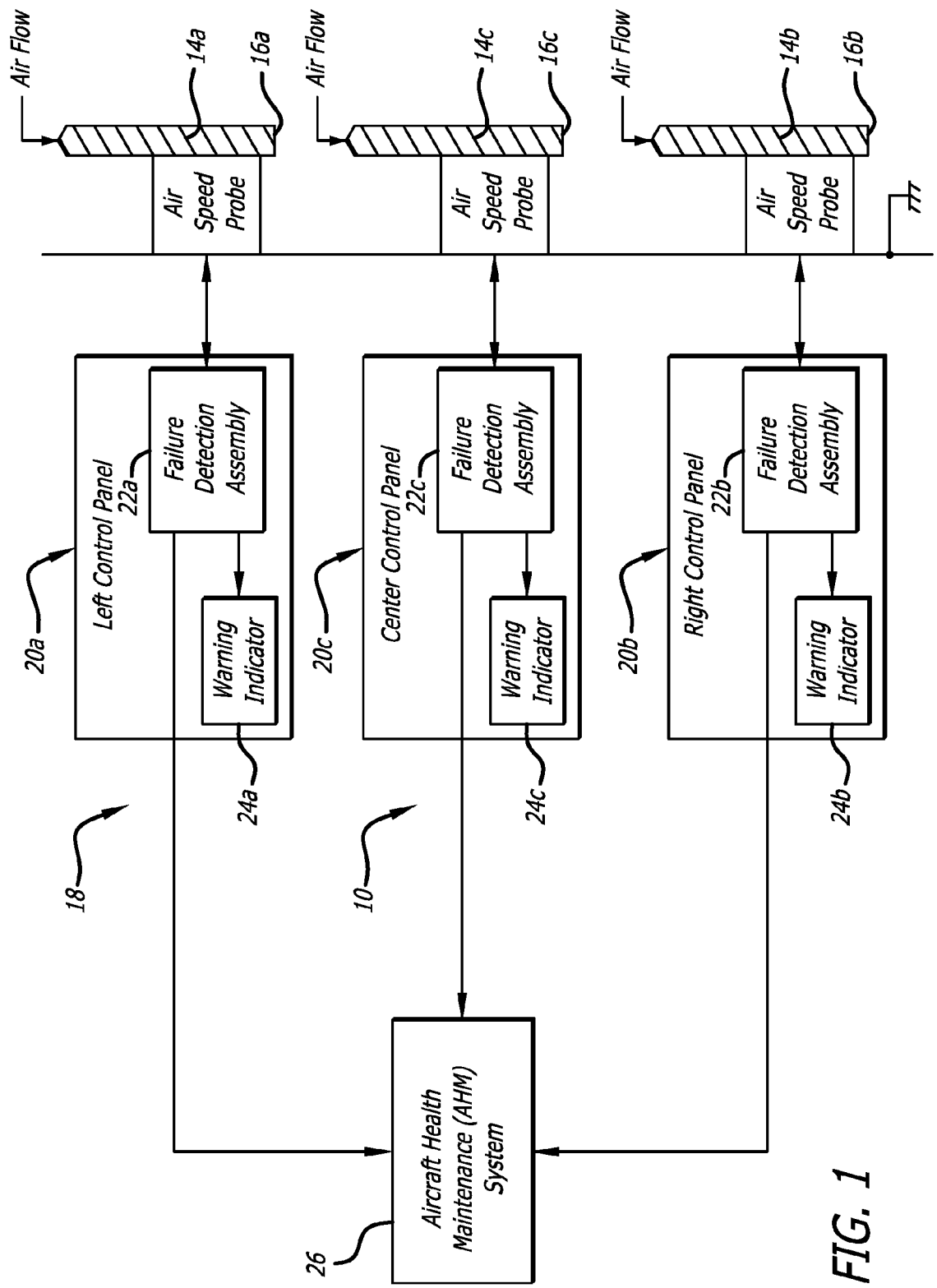
FIG. 1 is a block diagram of an on-board critical component monitoring system for use on an aircraft and constructed in accordance with one embodiment of the present inventions.

Referring to FIG. 1, an on-board critical component monitoring system 10 constructed in accordance with one embodiment of the present inventions will now be described. The on-board monitoring system 10 is configured for monitoring the health of critical components 14a-14c on an aircraft 12. In the illustrated embodiment, each of the critical components 14a-14c is an electrical deicing heater embedded or otherwise incorporated into an air speed probe 16a-16c that is mounted to the structure of the aircraft 12 and exposed to the external environment. However, any one of the critical components 14 can be any component, the failure or degradation of which may adversely affect the safety of the passengers or crew on the aircraft 12 or otherwise prevent or hinder the ability of the pilots to fly the aircraft 12 to its intended destination.

In the illustrated embodiment, the aircraft 12 is a wide-body aircraft, which can be defined as any aircraft having a fuselage wide enough to accommodate two passenger aisles, typically having a capacity between 200-850 passengers in the case of commercial flight. Currently, such wide-body aircraft include BOEING 747, BOEING 767, BOEING 777, BOEING 787, AIRBUS A300, AIRBUS A310, AIRBUS A330, AIRBUS A340, AIRBUS A350, AIRBUS A380, Ilyushin Il-86, Ilyushin Il-96, L-1011 TriStar, McDonnell Douglas DC-10, and McDonnell Douglas MD-11. However, the on-board monitoring system 10 is particularly useful for monitoring critical components in any fixed wing or rotary wing aircraft in which electrical current is returned from the critical components independently of the structure of the aircraft.

In the illustrated embodiment, a cockpit 18 of the aircraft 12 comprises three control panels 20a-20c (left, right, and center) that respectively power the air speed probes 16a-16c. On some airplane models, the center control panel and right control panel may be combine into one. The on-board monitoring system 10 comprises three identical failure detection assemblies 22a-22c for detecting failure in the respective electrical deicing heaters 14a-14c, three cockpit warning indicators 24a-24c for audibly and/or visibly warning the pilots of failures in any of the electrical deicing heaters 14a-14c, and an Aircraft Health Management (AHM) system 26 for collecting operation data from assemblies 22a-22c and monitoring any failures and the health trend of the electrical deicing heaters 14a-14c.

In the illustrated embodiment, each failure detection assembly 22 and cockpit warning/alert indicator 24 is incorporated into a respective one of the control panels 20 in order to monitor a particular heater 14. In essence, it is preferable that there be a failure detection assembly 22 for each heater 14 regardless of the number of control panels 20. For example, if there are two heaters 14, and corresponding air speed probes 16, for a particular control panel 20, two failure detection assemblies 22 may be incorporated into this control panel 20 for monitoring the failure detection assemblies 22.

A computer (not shown) receives input from all three air speed probes 16a-16c, and attempts to ascertain a single air speed of the aircraft 12 based on the three air speed data outputs from the air speed probes 16a-16c. For example, the computer may average a simple majority (the two air speed probes that provide the closest air speed to each other), and provide that single air speed to the three control panels 20a-20c. If none of the air speed probes 16a-16c agree with each other within a certain tolerance, an air speed disagreement warning is annunciated to the pilots in a conventional manner, and the different air speeds are respectively provided to the control panels 20a-20c.

The AHM system 26 comprises software that conventionally gathers and analyzes information for engine performance to increase the efficiency of the aircraft 12 and reduce the cost of operating the aircraft 12. The AHM system 26 also conventionally gathers and analyzes information from other critical components of the aircraft 12 to monitor the peak performance of these components over time to determine any trend in the performance of each component.

Typically, components operate within a few percentage points of peak performance. If there is a momentary glitch that causes the component to operate outside of its normal range, the AHM system 26 may ignore the glitch. However, if the operational parameters of the component gradually change in the direction that indicates that the performance of the component is degrading, thereby indicating to the airline that the component may need to be inspected, repaired, or replaced during the next scheduled maintenance service for the aircraft 12.

Figure 2:
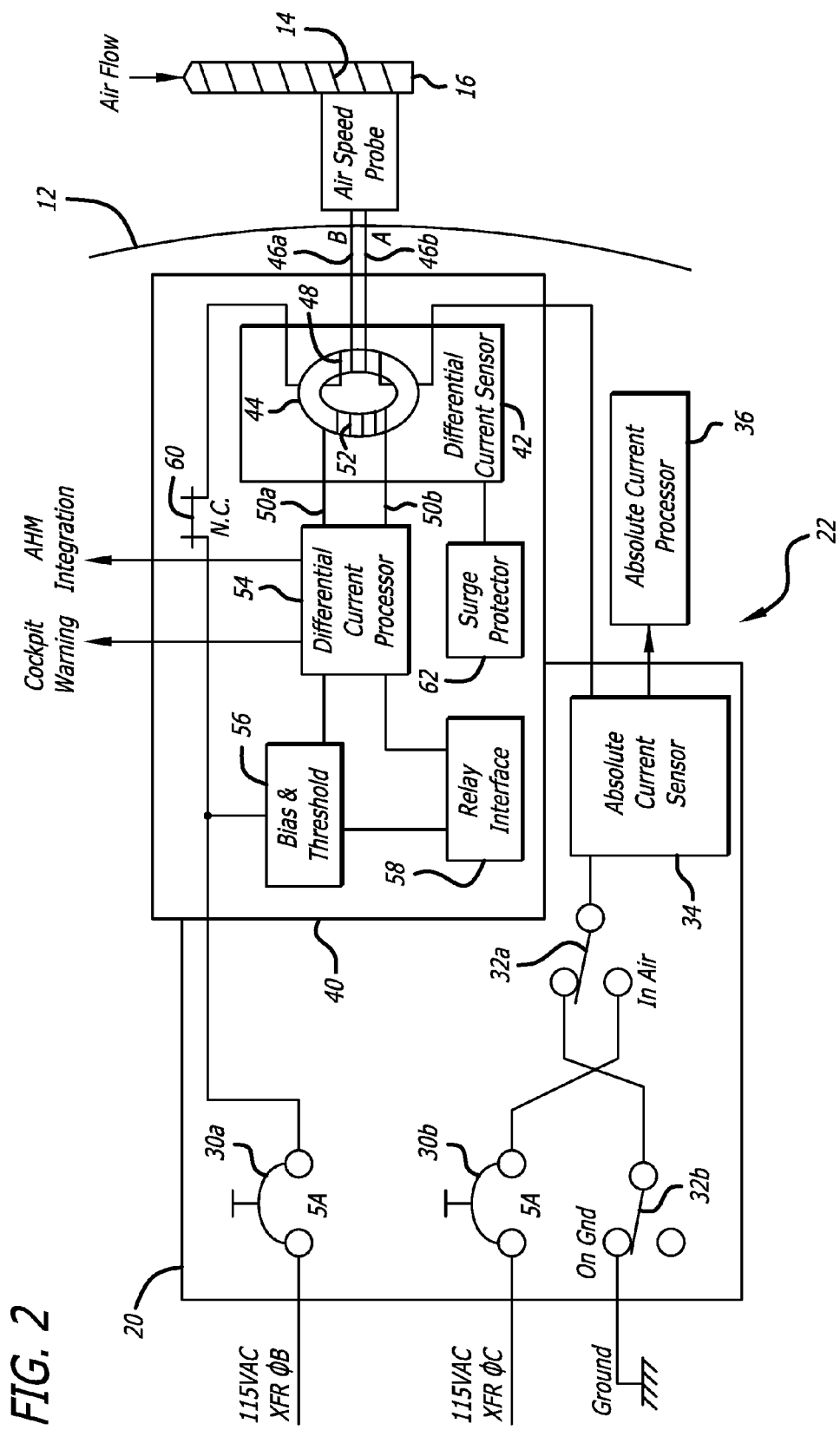
FIG. 2 is a block diagram of a fault detection assembly used in the on-board critical component monitoring system of FIG. 1.

Referring now to FIG. 2, each control panel 20 receives 115VAC from upstream Phase B and Phase C (φB and φC) power transformers. In a conventional manner, the control panel 20 delivers only one phase of the AC power to the corresponding electrical deicing heater 14 via a first circuit breaker 30a when the aircraft 12 is on the ground and delivers both phases of the AC power to the corresponding electrical deicing heater 14 respectively via the first circuit breaker 30a and a second circuit breaker 30b when the aircraft 12 is in the air. To this end, the respective control panel 20 comprises a pair of series connected switches 32a, 32b that can be alternately activated in the up-position, such that only one phase of the AC power (Phase B) is delivered to the corresponding electrical deicing heater 14 and returned from the corresponding electrical deicing heater 14 to ground when the aircraft 12 is on the ground, and activated in the down-position, such that the other phase of the AC power (Phase C), in addition to the first phase of the AC power (Phase B), is delivered to the heater 14 when the aircraft 12 is in the air. Thus, in performing its function of melting ice, snow, or frost from the corresponding air speed probe 16, each electrical deicing heater 14 is provided with the available power (115 VAC line-to-neutral) when the aircraft 12 is on the ground, and with the available power (200 VAC line-to-line) when the aircraft 12 is in the air.

The on-board monitoring system 10 is capable of detecting all failure modes of the critical components 14, including "fail-open," "fail-short," and all deterioration conditions therebetween.

To this end, each failure detection assembly 22 comprises an absolute current sensor 34 and an absolute current processor 36. The absolute current sensor 34 is configured for detecting an electrical absolute current returned from the heater 14, and generating an electrical absolute current signal in response to such detection. The absolute current processor 36 is configured for processing (e.g., filtering, amplifying, scaling, conditioning, delaying, digitizing, etc.) the electrical absolute current signal and comparing the processed electrical absolute current signal to at least one absolute current threshold, and triggering a failure indication based on the comparison, which comparison can either be performed using analog signals or digital signals.

In the illustrated embodiment, the absolute current processor 36 compares the electrical absolute current signal to a minimum absolute current threshold (e.g., 30 mA) and a maximum absolute current threshold (e.g., 3 A). If the electrical absolute current signal is below the minimum absolute current threshold, a fail-open condition is recognized for the heater 14, and if the absolute current signal is above the maximum absolute current threshold, a fail-short condition is recognized for the heater 14. In both cases, the absolute current processor 36 will indicate the heater failure to alert the pilots. Of course, if the electrical absolute current signal is between the minimum absolute current threshold and the maximum absolute current threshold, a no-fault condition is recognized for the heater 14, in which case, the absolute current processor 36 will not trigger the failure indication.

The failure indication triggered by the absolute current processor 36 may be any indication that alerts the relevant personnel (e.g., the pilots, ground crew, and/or airline) that the heater 14, along with the integrated air speed probe 16, must be replaced. For example, the failure indication may comprise generating and sending an alert signal to the cockpit warning/alert indicator 24 for audibly and/or visibly alerting the pilots that the heater 14 has completely failed and must be replaced, if and when the aircraft 12 is on the ground. Alternatively, or in addition, to sending an alert signal to the cockpit warning/alert indicator 24, the failure indication may comprise generating and sending an early warning signal to the AHM system 26 for alerting ground crew, if and when the aircraft 12 is on the ground, that the heater 14 has completely failed and must be replaced.

While the failure indications triggered by the absolute current processor 36 may ultimately alert the relevant personnel that an electrical deicing heater 14 has failed and must be replaced, it is still desirable to monitor and report the trend in the health status of the electrical deicing heaters 14, detect the failure of the electrical deicing heaters 14 in advance, and annunciate cockpit warnings at an early stage before complete failure of the electrical deicing heaters 14.

To this end, the on-board monitoring system 10 further comprises a deterioration monitoring module 40 configured for continually detecting the deterioration of the corresponding electrical deicing heater 14, providing this status to the AHM system 26, and if necessary, triggering a precautionary action in response to a deterioration of the heater 14 or a failure indication in response to a failure of the heater 14. Rather than examining the absolute electrical current returned from the respective heater 14, the deterioration monitoring module 40 examines the electrical differential current of the respective heater 14. Thus, the accuracy of the health detection module 40 is not adversely affected by fluctuations of supply voltage and absolute current amplitude due to tolerance, as well as variations and transient behaviors in the heater 14. The deterioration monitoring module 40 may be incorporated into each of the control panels 20 as an integrated add-on enhancement in a Line Replacement Unit (LRU) of the existing control panels 20. In this case, no changes of heater wiring, connectors, or reconfigurations are required.

The deterioration monitoring module 40 comprises a differential current sensor 42 configured for detecting an electrical differential current of the respective heater 14, and generating an electrical differential current signal in response thereto. The electrical differential current is the difference between a first electrical current input into the heater 14 at pin A and a second electrical current returned from the heater 14 at pin B. Significantly, the electrical differential current of the heater 14 is a good indicator of the extent that the heater 14 is shunting electrical current into the chassis of the aircraft 10 (e.g., due to corrosive effects), and thus, when the functioning of the heater 14 has degraded to the point where replacement of the heater 14 is needed. A fully functioning electrical deicing heater 14 has no or very little current leakage to the case of the integrated heater 14/air speed probe 16 and/or chassis of the aircraft 12, and thus, will have a balanced heater current (within a particular hardware tolerance range, e.g., 5 percent), producing no or very little differential electrical current. In contrast, a degraded electrical deicing heater 14 has substantial current leakage to the case of the integrated heater 14/air speed probe 16 and/or chassis of the aircraft 12, and thus, will have an imbalanced heater current, producing a significant amount of differential electrical current.

The differential current sensor 42 is preferably capable of electrically isolating the heater 14 from the remaining componentry of the deterioration monitoring module 40, thereby protecting the deterioration monitoring module 40 from electrical surges with respect to the common structural ground. In the illustrated embodiment, the differential current sensor 42 takes the form of an electrical current transformer. The electrical current transformer 42 comprises a magnetic core 44, and a first pair of wires 46a, 46b configured for respectively conducting electrical current to the heater 14 via pin A, and conducting electrical current from the heater 14 via pin B. The first pair of wires 46a, 46b are wound in the same direction around the magnetic core 44 to form a primary winding 48 on which the electrical differential current of the heater 14 appears. The electrical current transformer 42 further comprises a second pair of wires 50a, 50b wound in the same direction around the magnetic core 44 to form a secondary winding 52 on which the electrical differential current signal is generated.

The electrical current transformer 42 preferably has a turns-ratio greater than one, such that electrical differential current signal is an amplified or scaled version of the electrical differential current of the heater 14, thereby increasing the signal-to-noise ratio of the electrical differential current signal. Most preferably, the turns-ratio is large enough, such that a minimum amount of current imbalance in the heater 14 will produce sufficient signal levels relative to noise levels on the secondary winding 52 of the electrical current transformer 42. An instrument amplifier (not shown) with a predetermined gain setting may be provided at the output of the electrical current transformer 42 to further amplify the electrical differential current signal.

The deterioration monitoring module 40 further comprises a differential current processor 54 configured for processing (e.g., filtering, amplifying, scaling, conditioning, delaying, digitizing, etc.), and sending the processed electrical differential current signal to the AHM system 26. The differential current processor 54 is configured monitoring a deterioration trend of the respective heater 14 for early signs of deterioration by tracking variations in the electrical differential current of the heater 14 over time.

For example, a series of gradually increasing electrical differential current signals received by the AHM system 26 for a particular electrical deicing heater 14 over a couple years may indicate the health of the respective electrical deicing heater 14. A first electrical differential current signal may indicate that the heater 14 has deteriorated five percent (i.e., the electrical differential current is 5% of the input current); a future electrical differential current signal may indicate that the heater 14 has deteriorated ten percent (i.e., the electrical differential current is 10% of the input current), and so forth. The AHM system 26 may include the deterioration levels of the electrical deicing heaters 14, along with any raw data, in an Aircraft Condition Monitoring System report, which can be used for diagnostic, prognostic, and service alerts. For example, a decision to replace the heater 14, along with the integrated air speed probe 16, may be made when the heater 14 reaches a predetermined deterioration threshold (e.g., 50 percent).

In the illustrated embodiment, the differential current processor 54 is configured for comparing the electrical differential current signal to a first differential current threshold and a second electrical differential threshold, which comparisons can either be performed using analog signals or digital signals, and respectively triggering either a precautionary action or a failure indication based on these comparisons. In the illustrated embodiment, the differential current processor 54 triggers the precautionary action only if the electrical differential current signal exceeds the first differential current threshold, and triggers the failure indication only if the electrical differential current signal exceeds the second differential current threshold.

The precautionary action may be an early warning signal that warns the relevant personnel (e.g., the pilots, ground crew, and/or airline) that the heater 14 has deteriorated to a point where it must be continually monitored and inspected. For example, the precautionary action may comprise annunciating a cockpit warning to a pilot of the aircraft 12 that the heater 14 requires attention for inspection or replacement, e.g., by generating an early warning signal that is sent to the cockpit warning/alert indicator 24 for audibly and/or visibly warning the pilots that the heater 14 requires attention for inspection or replacement, if and when the aircraft 12 is on the ground. Alternatively, or in addition, to sending an early warning signal to the cockpit warning/alert indicator 24, the precautionary action may be generating and sending an early warning signal to the AHM system 26 for alerting ground crew that the heater 14 requires attention for inspection or replacement.

As with the absolute current processor 36 described above, the failure indication triggered by the differential current processor 54 may be an alert signal that alerts the relevant personnel (e.g., the pilots, ground crew, and/or airline) that the heater 14, along with the integrated air speed probe 16, must be replaced. For example, the failure indication may comprise an alert signal sent to the cockpit warning/alert indicator 24 for audibly and/or visibly alerting the pilots that the heater 14 has deteriorated to the point whether replacement is required, if and when the aircraft 12 is on the ground. Alternatively, or in addition, to sending an alert signal to the cockpit warning/alert indicator 24, the failure indication may comprise generating and sending an alert signal to the AHM system 26 for alerting ground crew, if and when the aircraft 12 is on the ground, that the heater 14 has deteriorated to the point where replacement is required.

In addition to sending an alert signal to the cockpit warning/alert indicator 24 and/or AHM system 26, the differential current processor 54 may disable the heater 14, thereby removing power to the heater 14. To this end, the differential current processor 36 is configured for generating an electrical current interruption signal. The deterioration monitoring module 40 further comprises a relay interface 58 configured for receiving the electrical current interruption signal from the differential current processor 54, and interrupting the electrical current input into the deteriorated heater 14 by opening normally closed (NC) relay contacts 60, thereby forcing the deteriorated heater 14 to a known failed state.

The second differential current threshold will generally be higher than the first differential current threshold. Thus, if maintenance of the heater 14 has been scheduled pursuant to a precautionary action, but not taken as suggested by the AHM system 26 while the heater 14 further deteriorates in service, the failure indication and disabling of the heater 14 will be triggered by the differential current processor 54.

The first differential current threshold may be scaled, taking into account the gain factor between the processed electrical differential current signal and the electrical differential current of the heater 14, such that the triggering of the precautionary action occurs when the electrical differential current of the heater 14 reaches a predetermined level (e.g., 30 percent). Similarly, the second differential current threshold may be scaled, taking into account the gain factor between the processed electrical differential current signal and the electrical differential current of the heater 14, such that the triggering of the failure indication occurs when the electrical differential current of the heater 14 reaches a predetermined level (e.g., 50 percent).

As briefly described above, the differential current processor 54 may filter and delay the electrical differential current signal output by the differential current sensor 42. These processing functions remove and/or delay any noise and glitches (e.g., current spike bursts induced by lightning strikes or electromagnetic interference (EMI) from radio frequency transmitters or the inrush of electrical current at the moment power is applied to the heater 14), thereby eliminating false triggering of the precautionary action, failure indication, and heater disablement that may be otherwise caused by these inadvertent transients.

The deterioration monitoring module 40 further comprises bias and threshold circuitry 56 configured for providing biasing voltage and current (including the differential current thresholds to the differential current processor 54) for the entire deterioration monitoring module 40 to operate. In the illustrated embodiment, the differential current thresholds may be adjusted based on specific system requirements and may vary from aircraft to aircraft. For example, one requirement may dictate that the heater 14 must be replaced when deteriorated at 50%, while another requirement may dictate that the heater 14 must be replaced when deteriorated at 40%. Thus, the differential current thresholds may be adjusted accordingly. The bias and threshold circuitry 56 is further configured for performing a built-in-test to verify that the entire deterioration monitoring module 40 is properly functioning.

It should be appreciated that although the absolute current processor 36 and differential current processor 54 are illustrated and described as two different processors, a single integrated processor can be used to perform the respective functions of the absolute current processor 36 and differential current processor 54. However, performing the respective functions with two physically distinct processors allows the functionality of the deterioration monitoring module 40 to be adding into the LRU without significant modification of already existing circuitry.

The deterioration monitoring module 40 further comprises an electrical surge protector 62 configured for suppressing voltage spikes induced on the differential current sensor 42 induced by lightning strikes and electromagnetic interference (EMI) transients.

The electrical surge protector 62 may comprise a metal enclosure and wire conduit that shields the differential current sensor 42 inside from the induced current that might be present on the surface of the nearby chassis of the aircraft 12. The electrical surge protector 62 may further comprise transient suppression Metal Oxide Varistors (MOV) or Transient Voltage Supressors (TVS) or other equivalent components to further protect the differential current sensor 42 from power surges.

Having described the arrangement and functions of the on-board monitoring system 10, one method 100 of operating the on-board monitoring system 10 for monitoring the health of the electrical deicing heater 14 will now be described with respect to FIG. 3. First, in accordance with the normal operation of the electrical deicing heater 14, a first electrical current is input into the heater 14 (step 102), and a second electrical current is returned from the heater 14 (step 104), thereby providing heat to the integrated air speed probe 16. Next, the absolute current sensor 34 detects the electrical absolute current returned from the heater 14 (in this case, the second electrical current) (step 106), and generates an electrical absolute current signal from the electrical absolute current (step 108).

Next, the absolute current processor 36 processes the electrical absolute current signal (step 110) (e.g., filtering, amplifying, scaling, conditioning, delaying, digitizing, etc.), and optionally sends the processed electrical absolute current signal to the AHM system 26. The absolute current processor 36 compares the electrical absolute current signal to at least one absolute current threshold.

In particular, the absolute current processor 36 determines if the electrical absolute current signal is below the minimum absolute current threshold (step 112). If the electrical absolute current signal is below the minimum absolute current threshold, the absolute current processor 36 determines that the heater 14 is in a fail-open condition (step 114), and in response thereto, triggers a heater failure indication (step 116). The failure indication may be, e.g., generating and sending an alert signal to the cockpit warning/alert indicator 24 for audibly and/or visibly alerting the pilots that the heater 14 is in a fail-open condition, and/or generating and sending an alert signal to the AHM system 26 for alerting ground crew that the heater 14 is in a fail-open condition. At the next available opportunity, the heater 14, along with the incorporated air speed probe 16, is then inspected, its failure verified, and, if necessary, the heater 14 and air speed probe 16 replaced, by ground personnel (step 118).

If the electrical absolute current signal is above the minimum absolute current threshold at step 112, the absolute current processor 34 determines if the electrical absolute current signal is above the maximum absolute current threshold (step 120). If the electrical absolute current signal is above the maximum absolute current threshold, the absolute current processor 34 determines that the heater 14 is in a fail-short condition (step 122), and in response thereto, triggers a heater failure indication (step 116). The heater failure indication may be, e.g., generating and sending an alert signal to the cockpit warning/alert indicator 24 for audibly and/or visibly alerting the pilots that the heater 14 is in a fail-short condition and/or generating and sending an alert signal to the AHM system 26 for alerting ground crew that the heater 14 is in a fail-short condition. At the next available opportunity, the heater 14, along with the incorporated air speed probe 16, is then inspected, its failure verified, and, if necessary, the heater 14 and air speed probe 16 replaced, by ground personnel (step 118).

If the electrical absolute current signal is below the maximum absolute current threshold at step 120, the absolute current processor 34 determines that the heater 14 is neither in a fail-open condition or a fail-short condition (step 124).

Simultaneously with the above-described steps, or after it is determined that the heater 14 is not in any fail condition, the differential current sensor 42 detects the electrical differential current of the heater 14 (in this case, the difference between the first and second electrical currents) (step 126), and generates an electrical differential current signal from the electrical differential current (step 128).

Next, the differential current processor 54 processes (e.g., filtering, amplifying, scaling, conditioning, delaying, digitizing, etc.) the electrical differential current (step 130), and optionally sends the processed electrical differential current signal to the AHM system 26. Then, the differential current processor 54 determines a deterioration level of the heater 14 based on the processed electrical differential current signal, compares the deterioration level of the heater 14 to a deterioration threshold, and recommends or requires replacement of the heater 14 based on the comparison.

In particular, the differential current processor 54 compares the processed electrical differential current signal to the first differential current threshold (step 132). If the electrical differential current signal is below the first differential current threshold, the differential current processor 54 determines that the heater 14 is operating in a normal range, and has not deteriorated to an unsafe level (step 134). As such, the deterioration trend of the heater 14 need not be monitored, and therefore, the process returns to step 106.

In contrast, if the electrical differential current signal is above the first differential current threshold, the differential current processor 54 determines that the heater 14 has developed a noticeable differential current (step 136), and therefore, monitors the deterioration trend of the heater 14 by tracking variations in the electrical differential current of the heater 14 over time (step 138). Thus, the differential current processor 54 compares the electrical differential current to the second differential current threshold (e.g., 40 percent deterioration) (step 140). If the electrical differential current signal is below the second differential current threshold, the differential current processor 54 triggers a precautionary action (step 142). The precautionary action may comprise, e.g., the precautionary action may comprise annunciating a cockpit warning to a pilot of the aircraft 12 that the heater 14 requires attention for inspection or replacement, e.g., generating and sending an early warning signal to the cockpit warning/alert indicator 24 for audibly and/or visibly warning the pilots that the heater 14 has deteriorated to a point where it requires inspection or replacement and/or sending an early warning signal to the AHM system 26 indicating early signs of heater deterioration and recommending or scheduling inspection or replacement of the heater 14. The process may then return to step 106. The first differential current threshold is preferably less than the second differential current threshold; such that the heater 14 may be proactively replaced before it deteriorates further to an unsafe level.

If the electrical differential current signal happens to be above the second differential current threshold at step 138, the differential current processor 54 determines that the heater 14 has deteriorated sufficiently to an unsafe level (step 144), and in response thereto, places the deteriorated heater 14 into a known failed state, and in particular, by generating and sending an electrical current interruption signal to the relay interface 58, which interrupts the electrical current input into the deteriorated heater 14 by opening normally closed (NC) relay contacts 60, thereby disabling the deteriorated heater 14 by forcing it into a fail-open state (step 146). The differential current processor 54 then triggers a heater failure indication (step 116). The failure indication may be, e.g., generating and sending an alert signal to the cockpit warning/alert indicator 24 for audibly and/or visibly alerting the pilots that the heater 14 is in a fail condition, and/or generating and sending an alert signal to the AHM system 26 for alerting ground crew that the heater 14 is in a fail condition. At the next available opportunity, the heater 14, along with the incorporated air speed probe 16, is then inspected, its failure verified, and, if necessary, the heater 14 and air speed probe 16 replaced, by ground personnel (step 118).

Although the differential current processor 54 is described as monitoring the deterioration trend of the heater 14 and triggering a precautionary action by sending an early warning signal to the AHM system 26, it should be appreciated that the AHM system 26, itself, may monitor the deterioration trend of the heater 14 based on the processed electrical differential signal received from the differential current processor 54, and determine early signs of deterioration of the heater 14 and recommend inspection or replacement of the heater 14 based on a comparison of the processed electrical differential signal to one or more of the differential current thresholds as described above.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

I claim:

1. A system for monitoring a critical component on an aircraft, comprising:
a differential current sensor configured for detecting an electrical differential current of the critical component, and generating an electrical differential current signal from the detected electrical differential current, the electrical differential current being a difference between a first electrical current input into the critical component and a second electrical current returned from the critical component; and
a differential current processor configured for comparing the electrical differential current signal to at least one differential current threshold, and triggering a precautionary action based on the comparison,
wherein the differential current processor is configured for triggering the precautionary action only if the electrical differential current signal exceeds one of the at least one differential current threshold.

2. The system of claim 1, wherein the differential current processor is further configured for monitoring a deterioration trend of the critical component by tracking variations in the electrical differential current of the critical component over time.

3. The system of claim 1, wherein triggering the precautionary action comprises generating an early warning signal indicating that the critical component that the critical component requires attention for inspection or replacement.

4. The system of claim 3, further comprising a cockpit warning/alert indicator configured for receiving the early warning signal and annunciating a cockpit warning to a pilot of the aircraft.

5. The system of claim 3, further comprising an Aircraft Health Management (AHM) system configured for receiving the early warning signal from the differential current processor and recommending inspection or replacement of the critical component.

6. The system of claim 1, wherein the at least one differential current threshold comprises a first differential current threshold and a second differential current threshold greater than the first differential current threshold, wherein the differential current processor is configured for triggering the precautionary action based on the comparison between the electrical differential current signal and the first differential current threshold, and triggering a failure indication based on the comparison between the electrical differential current signal and the second differential current threshold.

7. The system of claim 6, wherein triggering the failure indication comprises generating an alert signal indicating that the critical component has deteriorated to a point requiring replacement.

8. The system of claim 6, wherein the differential current processor is further configured for generating an electrical current interruption signal based on the comparison between the electrical differential current signal and the second differential current threshold, the system further comprising a relay interface configured for receiving the electrical current interruption signal, and in response thereto, interrupting the first electrical current input into the critical component, thereby forcing the critical component to a known failed state.

9. The system of claim 1, further comprising an absolute current sensor configured for detecting an electrical absolute current returned from the critical component, and generating an electrical absolute current signal from the detected electrical absolute current, wherein the absolute current processor is configured for comparing the electrical absolute current signal to at least one absolute current threshold, and triggering a failure indication based on the comparison.

10. The system of claim 9, wherein the at least one absolute current threshold comprises a minimum absolute current threshold and a maximum absolute current threshold, and the absolute current processor is configured for triggering the failure indication only if the electrical absolute current signal is below the minimum absolute current threshold or above the maximum absolute current threshold.

11. A method of monitoring a critical component on an aircraft, comprising:
inputting a first electrical current into the critical component;
returning a second electrical current by the critical component;
detecting an electrical differential current of the critical component, the electrical differential current being a difference between the first electrical current and the second electrical current;
generating an electrical differential current signal from the detected electrical differential current;
comparing the electrical differential current signal to at least one differential current threshold; and
triggering a precautionary action based on the comparison,
wherein the precautionary action is only triggered if the electrical differential current signal exceeds one of the at least one differential current threshold.

12. The method of claim 11, further comprising monitoring a deterioration trend of the critical component by tracking variations in the electrical differential current of the critical component over time.

13. The method of claim 11, wherein triggering the precautionary action comprises annunciating a cockpit warning to a pilot of the aircraft that the critical component requires attention for inspection or replacement.

14. The method of claim 11, wherein triggering the precautionary action comprises informing an Aircraft Health Management (AHM) system that the critical component requires attention for inspection or replacement.

15. The method of claim 11, wherein the at least one differential current threshold comprises a first differential current threshold and a second differential current threshold greater than the first differential current threshold, wherein is the precautionary action is triggered based on the comparison between the electrical differential current signal and the first differential current threshold, the method further comprising triggering a failure indication based on the comparison between the electrical differential current signal and the second differential current threshold.

16. The method of claim 15, wherein triggering the failure indication comprises annunciating a cockpit alert to a pilot of the aircraft that the critical component requires replacement.

17. The method of claim 15, further comprising, based on the comparison between the electrical differential current signal and the second differential current threshold, interrupting the first electrical current input into the critical component, thereby forcing the critical component to a known failed state.

18. A system for monitoring a critical component on an aircraft, comprising:
a differential current sensor configured for detecting an electrical differential current of the critical component, and generating an electrical differential current signal from the detected electrical differential current, the electrical differential current being a difference between a first electrical current input into the critical component and a second electrical current returned from the critical component; and
at least one processor configured for processing the electrical differential current signal, and monitoring a deterioration trend of the critical component by tracking variations in the processed electrical differential current over time.

19. The system of claim 18, wherein the at least one processor comprises a differential current processor configured for both processing the electrical differential current signal, and monitoring the deterioration trend of the critical component.

20. The system of claim 18, wherein the at least one processor comprises a differential current processor configured for processing the electrical differential current signal, and an Aircraft Health Management (AHM) system configured for receiving the processed electrical differential current signal from the differential current processor, and monitoring the deterioration trend of the critical component.

21. The system of claim 18, wherein the at least one processor is further configured for determining a deterioration level of the critical component based on the processed electrical differential current signal, comparing the deterioration level of the critical component to a deterioration threshold, and recommending or requiring replacement of the critical component based on the comparison.

22. A method for monitoring a critical component on an aircraft, comprising:
inputting a first electrical current into the critical component;
returning a second electrical current by the critical component;
detecting an electrical differential current of the critical component, the electrical differential current being a difference between the first electrical current and the second electrical current;
generating an electrical differential current signal from the detected electrical differential current;
processing the electrical differential current signal; and
monitoring a deterioration trend of the critical component based on the processed electrical differential current signal by tracking variations in the electrical differential current of the critical component over time.

23. The method of claim 22, further comprising:
determining a deterioration level of the critical component based on the processed electrical differential current signal;
comparing the deterioration level of the critical component to a deterioration threshold; and
recommending or requiring replacement of the critical component based on the comparison.

\* \* \* \* \*